(12) United States Patent
Do et al.

(10) Patent No.: US 11,688,737 B2
(45) Date of Patent: Jun. 27, 2023

(54) INTEGRATED CIRCUIT DEVICES INCLUDING VERTICAL FIELD-EFFECT TRANSISTORS

(71) Applicant: Samsung Electronics Co., Ltd., Suwon-si (KR)

(72) Inventors: Jung Ho Do, Hwaseong-si (KR); Seung Hyun Song, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 233 days.

(21) Appl. No.: 16/947,692

(22) Filed: Aug. 13, 2020

(65) Prior Publication Data

US 2021/0242202 A1 Aug. 5, 2021

Related U.S. Application Data

(60) Provisional application No. 62/970,274, filed on Feb. 5, 2020.

(51) Int. Cl.
*H01L 27/092* (2006.01)
*H01L 29/78* (2006.01)
*H01L 29/423* (2006.01)
*H01L 29/417* (2006.01)
*H01L 21/8234* (2006.01)
*H10B 63/00* (2023.01)

(52) U.S. Cl.
CPC ...... *H01L 27/092* (2013.01); *H01L 29/41741* (2013.01); *H01L 29/42356* (2013.01); *H01L 29/7827* (2013.01); *H01L 29/7828* (2013.01); H01L 21/823487 (2013.01); H10B 63/34 (2023.02)

(58) Field of Classification Search
CPC ............ H01L 27/2454; H01L 29/7828; H01L 21/823487; H01L 21/823885; H01L 27/00; H01L 27/01; H01L 27/02; H01L 27/14; H01L 27/15; H01L 27/013; H01L 27/0203; H01L 27/04; H01L 27/12; H01L 27/142; H01L 27/144; H01L 29/00; H01L 29/02; H01L 29/40; H01L 29/66
See application file for complete search history.

(56) References Cited

U.S. PATENT DOCUMENTS

| | | | | |
|---|---|---|---|---|
| 8,728,892 | B2 * | 5/2014 | Ou | ................. H01L 21/823431 257/E29.026 |
| 9,620,509 | B1 * | 4/2017 | Pao | ....................... H10B 10/12 |
| 9,786,784 | B1 * | 10/2017 | Song | ..................... H01L 29/785 |
| 9,935,106 | B2 | 4/2018 | Nowak et al. | |
| 9,947,664 | B1 * | 4/2018 | Anderson | .......... H01L 29/7827 |
| 10,186,510 | B2 | 1/2019 | Schultz | |

(Continued)

*Primary Examiner* — Maliheh Malek
(74) *Attorney, Agent, or Firm* — Myers Bigel, P.A.

(57) ABSTRACT

Integrated circuit devices including standard cells are provided. The standard cells may include a first vertical field effect transistor (VFET) including a first channel region and having a first conductivity type and a second VFET including a second channel region and having a second conductivity type that is different from the first conductivity type. Each of the first channel region and the second channel region may extend longitudinally in a first horizontal direction, and the first channel region may be spaced apart from the second channel region in a second horizontal direction that is perpendicular to the first horizontal direction.

19 Claims, 19 Drawing Sheets

(56) References Cited

U.S. PATENT DOCUMENTS

| | | | |
|---|---|---|---|
| 10,283,607 B2 | 5/2019 | Chen | |
| 10,297,687 B2 | 5/2019 | Heo et al. | |
| 10,418,484 B1 | 9/2019 | Xie et al. | |
| 10,593,701 B2* | 3/2020 | Seo | H01L 27/0207 |
| 11,043,564 B2* | 6/2021 | Do | H01L 27/092 |
| 11,056,489 B2* | 7/2021 | Do | H01L 23/5226 |
| 11,569,215 B2* | 1/2023 | Kim | H01L 25/50 |
| 11,605,708 B2* | 3/2023 | Hong | H01L 21/76224 |
| 2003/0060015 A1* | 3/2003 | Layman | H01L 21/823437 257/E21.629 |
| 2015/0243765 A1* | 8/2015 | Anderson | H01L 27/1203 438/268 |
| 2015/0370947 A1* | 12/2015 | Moroz | H10B 10/12 716/119 |
| 2016/0329899 A1* | 11/2016 | Masuoka | H01L 27/092 |
| 2017/0317211 A1* | 11/2017 | Kim | H01L 29/66666 |
| 2018/0005895 A1* | 1/2018 | Cheng | H01L 21/823487 |
| 2018/0005904 A1* | 1/2018 | Lee | H01L 29/045 |
| 2018/0121593 A1* | 5/2018 | Anderson | H01L 27/0207 |
| 2018/0190670 A1* | 7/2018 | Ryckaert | H01L 27/11807 |
| 2018/0254218 A1* | 9/2018 | Cheng | H01L 21/823462 |
| 2018/0269329 A1* | 9/2018 | Balakrishnan | H01L 29/7889 |
| 2018/0308762 A1* | 10/2018 | Anderson | H01L 29/66666 |
| 2018/0358347 A1 | 12/2018 | Jeong et al. | |
| 2019/0189520 A1* | 6/2019 | Zhang | H01L 21/823487 |
| 2019/0229117 A1* | 7/2019 | Zhang | H01L 27/0207 |
| 2019/0279990 A1 | 9/2019 | Paul et al. | |
| 2019/0318963 A1* | 10/2019 | Miao | H01L 21/311 |
| 2019/0385917 A1* | 12/2019 | Lee | H01L 21/823878 |
| 2020/0035691 A1* | 1/2020 | Reznicek | H01L 29/105 |
| 2020/0035829 A1* | 1/2020 | Do | H03K 3/3562 |
| 2020/0144254 A1* | 5/2020 | Song | H01L 29/0847 |
| 2020/0144260 A1* | 5/2020 | Do | H01L 21/823871 |
| 2020/0144378 A1* | 5/2020 | Lee | H01L 29/66803 |
| 2020/0144417 A1* | 5/2020 | Do | H01L 21/823885 |
| 2020/0144418 A1* | 5/2020 | Do | H01L 27/0207 |
| 2020/0295134 A1* | 9/2020 | Do | H01L 29/0847 |
| 2020/0295146 A1* | 9/2020 | Do | H01L 21/823487 |
| 2020/0312999 A1* | 10/2020 | Reznicek | H01L 29/66666 |
| 2020/0343241 A1* | 10/2020 | Wu | H01L 21/823487 |
| 2020/0356717 A1* | 11/2020 | Do | H01L 27/092 |
| 2020/0403096 A1* | 12/2020 | Jung | H01L 27/085 |
| 2021/0104550 A1* | 4/2021 | Do | H01L 27/092 |
| 2021/0111257 A1* | 4/2021 | Jun | H01L 27/092 |
| 2021/0111270 A1* | 4/2021 | Sohn | H10B 10/12 |
| 2021/0242091 A1* | 8/2021 | Jun | H01L 29/66666 |
| 2021/0328056 A1* | 10/2021 | Baek | H01L 27/092 |
| 2021/0376140 A1* | 12/2021 | Li | H01L 27/092 |
| 2022/0045050 A1* | 2/2022 | Kim | H01L 29/7827 |
| 2022/0059677 A1* | 2/2022 | Xie | H01L 21/823814 |
| 2022/0068903 A1* | 3/2022 | Kim | H10B 43/40 |
| 2022/0189944 A1* | 6/2022 | Do | H01L 29/41733 |

* cited by examiner

INTEGRATED CIRCUIT DEVICES INCLUDING VERTICAL FIELD-EFFECT TRANSISTORS

CROSS-REFERENCE TO RELATED APPLICATION

This application claims priority to U.S. Provisional Application Ser. No. 62/970,274, entitled VFET CELL ARCHITECTURE, filed in the USPTO on Feb. 5, 2020, the disclosure of which is hereby incorporated by reference herein in its entirety.

FIELD

The present disclosure generally relates to the field of electronics and, more particularly, to vertical field-effect transistor (VFET) devices.

BACKGROUND

VFET devices have been researched because of their high scalability. Further, cell structures of VFET devices have been researched to improve their performance.

SUMMARY

According to some embodiments of the present inventive concept, integrated circuit devices may include standard cells, and the standard cells may include a first vertical field effect transistor (VFET) including a first channel region and having a first conductivity type and a second VFET including a second channel region and having a second conductivity type that is different from the first conductivity type. Each of the first channel region and the second channel region may extend longitudinally in a first horizontal direction, and the first channel region may be spaced apart from the second channel region in a second horizontal direction that is perpendicular to the first horizontal direction.

According to some embodiments of the present inventive concept, integrated circuit may include standard cells, and the standard cells may include a first vertical field effect transistor (VFET) including a first bottom source/drain region in a substrate, a first channel region and a first top source/drain region sequentially stacked on the first bottom source/drain region in a vertical direction. The standard cells may also include a second VFET including a second bottom source/drain region in the substrate, a second channel region and a second top source/drain region sequentially stacked on the second bottom source/drain region in the vertical direction. The standard cells may further include a common gate layer including a first portion that is on a side surface of the first channel region and is a first gate electrode of the first VFET and a second portion that is on a side surface of the second channel region and is a second gate electrode of the second VFET, and a gate contact that is between the first channel region and the second channel region and contacts the common gate layer. The first top source/drain region may have a first conductivity type, and the second top source/drain region may have a second conductivity type that is different from the first conductivity type. Each of the first channel region and the second channel region may extend longitudinally in a first horizontal direction, and the gate contact may be spaced apart from the first channel region in a second horizontal direction that is perpendicular to the first horizontal direction.

According to some embodiments of the present inventive concept, integrated circuit may include standard cells, and the standard cells may include a first vertical field effect transistor (VFET) having a first conductivity type and a second VFET having a second conductivity type that is different from the first conductivity type. The first VFET may include two first channel regions that are spaced apart from each other in a first horizontal direction. The second VFET may include a second channel region, and the second channel region is spaced apart from the two first channel regions in the first horizontal direction.

DETAILED DESCRIPTION

A height of a standard cell of integrated circuit devices has decreased to increase an integration density of the integrated circuit devices. Accordingly, a length of a channel region in a height direction of a standard cell has decreased, and a current flowing through the channel region has also decreased. According to some embodiments of the present inventive concept, a channel region may extend longitudinally in a width direction of a standard cell, and a length of the channel region may not be restricted by a height of the standard cell and may increase independently from the height of the standard cell.

Logic circuits may be designed using various standard cells such as an inverter, a 2-input NAND gate, a 3-input NAND gate, a 2-input NOR gate, a 3-input NOR gate, an And-Or inverter (AOI), an Or-And inverter (OAI), an XNOR gate, an XOR gate, a multiplexer (MUX), a latch, and a D-flip-flop.

Figure 1:
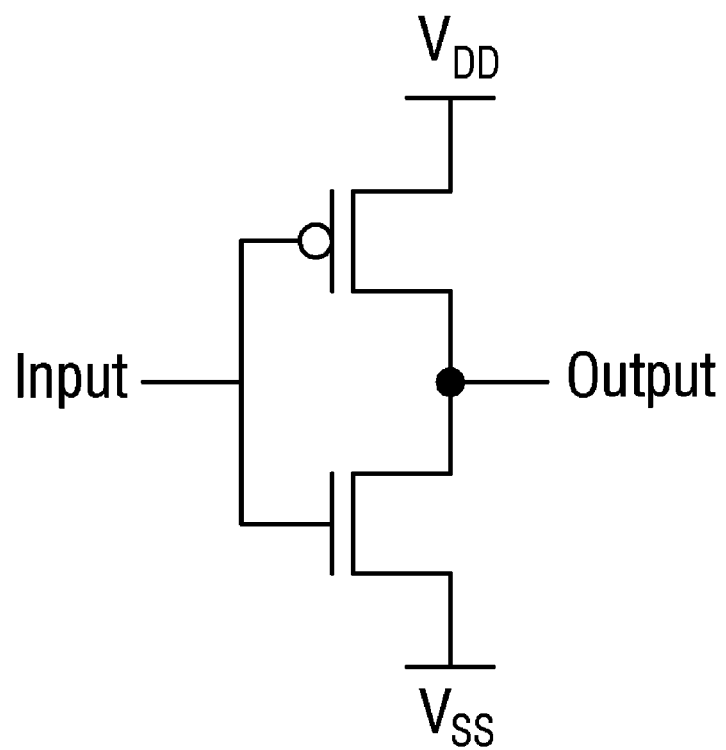
FIG. 1 is a circuit diagram of an inverter according to some embodiments of the present inventive concept.
Figure 2A:
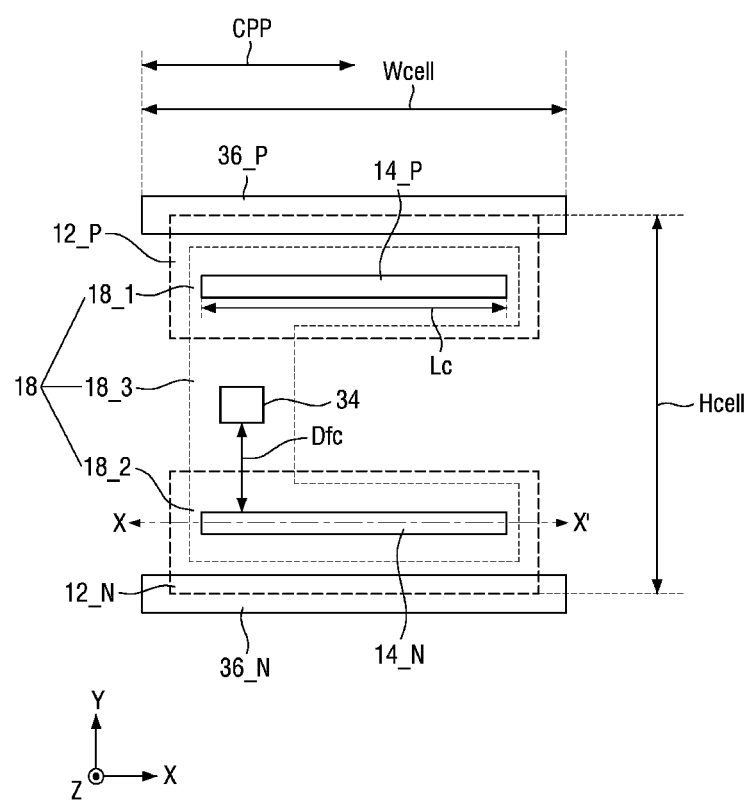
FIGS. 2A and 2B show layouts of the inverter of FIG. 1 according to some embodiments of the present inventive concept.
Figure 2B:
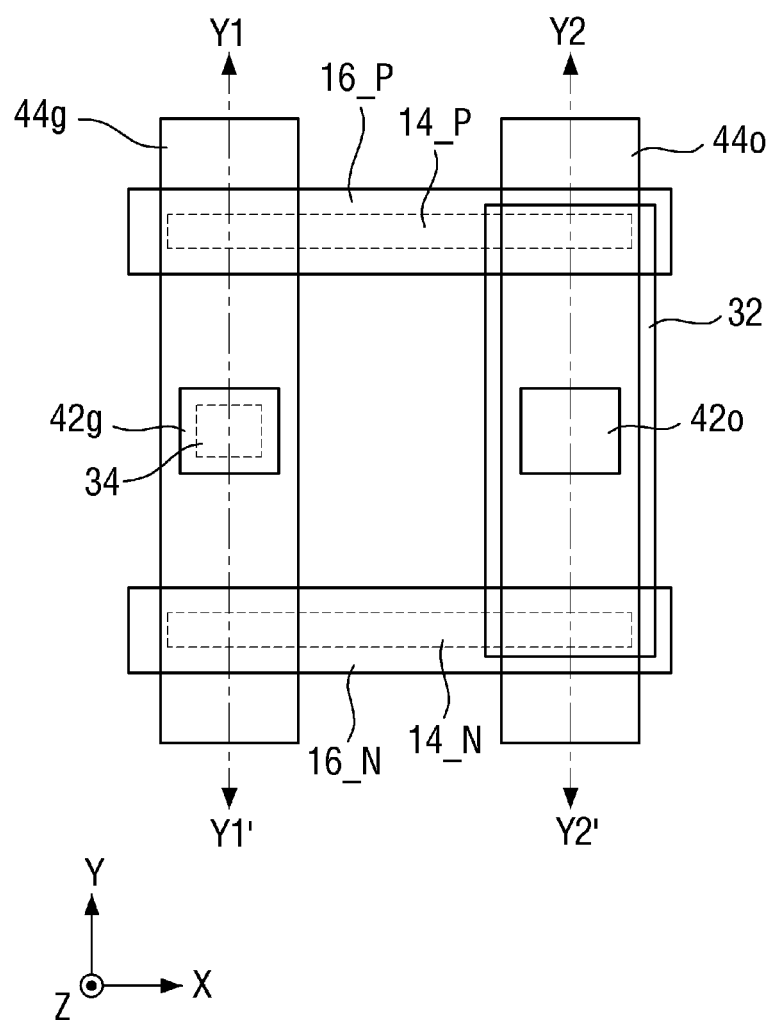
Figure 3A:
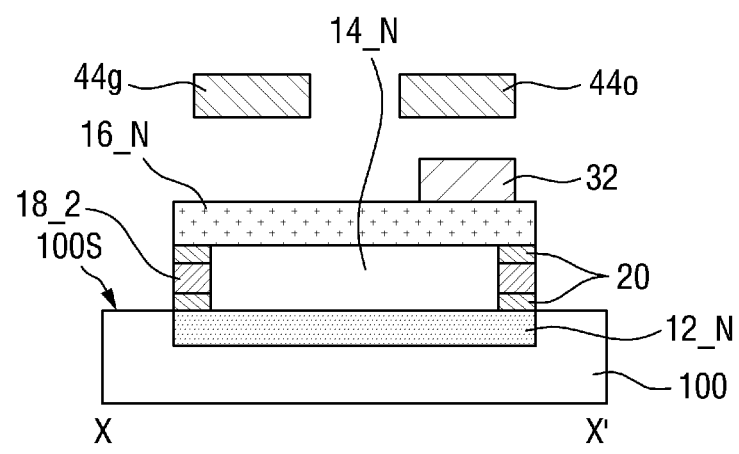
FIG. 3A is a cross-sectional view taken along the line X-X' of FIG. 2A, and FIGS. 3B and 3C are cross-sectional views taken along the lines Y1-Y1' and Y2-Y2' of FIG. 2B, respectively, according to some embodiments of the present inventive concept.
Figure 3B:
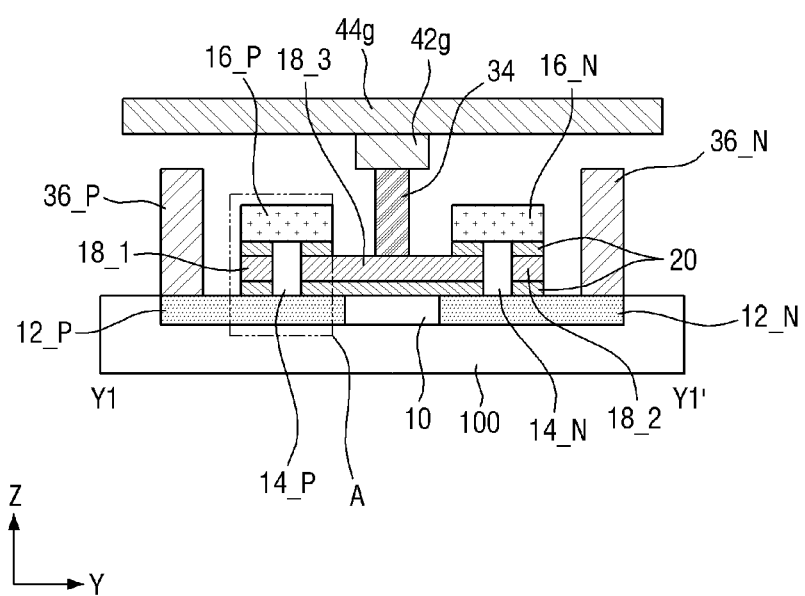
Figure 3C:
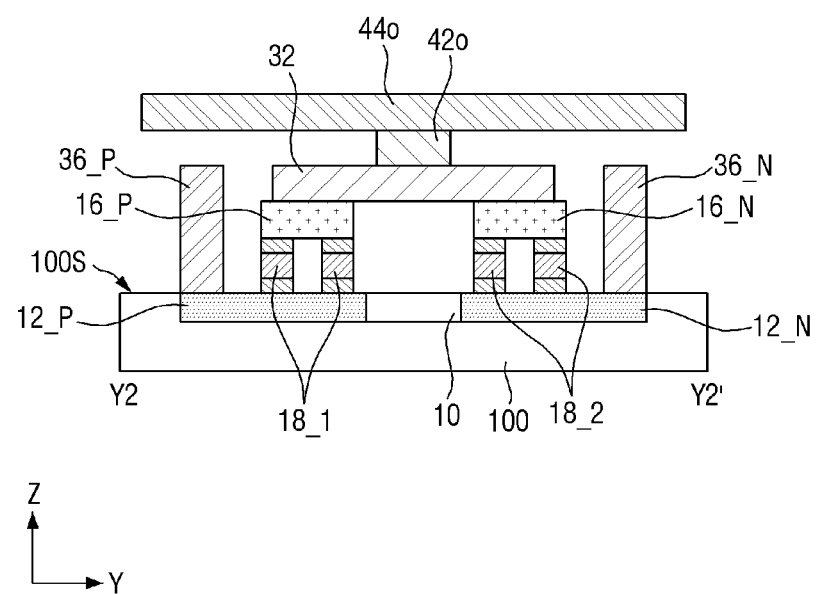

In some embodiments, a standard cell may be an inverter. FIG. 1 is a circuit diagram of an inverter, and FIGS. 2A and 2B show layouts of the inverter of FIG. 1 according to some embodiments of the present inventive concept. Each of FIGS. 2A and 2B shows a group of elements, rather than all elements, to simplify drawings. FIG. 3A is a cross-sectional view taken along the line X-X' of FIG. 2A, and FIGS. 3B and 3C are cross-sectional views taken along the lines Y1-Y1' and Y2-Y2' of FIG. 2B, respectively, according to some embodiments of the present inventive concept.

Referring to FIG. 1, the inverter may include a P-type VFET and an N-type VFET. A drain voltage $V_{DD}$ may be applied to the P-type VFET, and a source voltage $V_{SS}$ may be applied to the N-type VFET. Both the P-type VFET and the N-type VFET may receive a common input (i.e., Input in FIG. 1) and may output a common output (i.e., Output in FIG. 1).

Referring to FIGS. 2A and 2B and FIGS. 3A, 3B, and 3C, the P-type VFET of the inverter may include a first bottom source/drain region 12_P, a first channel region 14_P, and a first top source/drain region 16_P. The first bottom source/drain region 12_P may be in a substrate 100, and the first bottom source/drain region 12_P, the first channel region 14_P, and the first top source/drain region 16_P may be sequentially stacked on the substrate 100 in a vertical direction Z. The vertical direction Z may be perpendicular to a surface 100S of the substrate 100. The N-type VFET of the inverter may include a second bottom source/drain region 12_N, a second channel region 14_N, and a second top source/drain region 16_N. The second bottom source/drain region 12_N may be in the substrate 100, and the second bottom source/drain region 12_N, the second channel region 14_N, and the second top source/drain region 16_N may be sequentially stacked on the substrate 100 in the vertical direction Z.

The standard cell may have a width Wcell in a first horizontal direction X. The first horizontal direction X may be a width direction of the standard cell and may be parallel to the surface 100S of the substrate 100. The width Wcell may be wider than a contacted poly pitch (CPP) of the standard cell. In some embodiments, the width Wcell may be equal to two times the CPP. The CPP of the standard cell may be predetermined by a design rule of an integrated circuit device in which the standard cell is included. In some embodiments, the CPP of the standard cell may be a gate pitch of the integrated circuit device.

The standard cell may have a height Hcell in a second horizontal direction Y. The second horizontal direction Y may be a height direction of the standard cell. The second horizontal direction Y may be parallel to the surface 100S of the substrate 100 and may be perpendicular to the first horizontal direction X. In some embodiments, the height Hcell of the standard cell may be a pitch of bottom contacts (e.g., 36_P and 36_N in FIG. 2A). The height Hcell of the standard cell may affect a distance Dfc between a gate contact (e.g., 34 in FIG. 2A) and a channel region (e.g., 14_P or 14_N in FIG. 2A) in the second horizontal direction Y.

In some embodiments, each of the first channel region 14_P and the second channel region 14_N may extend longitudinally in the first horizontal direction X as illustrated in FIG. 2A. Each of the first channel region 14_P and the second channel region 14_N may have a length Lc in the first horizontal direction X, and the length Lc may be longer than the CPP as illustrated in FIG. 2A. The first channel region 14_P and the second channel region 14_N may be spaced apart from each other in the second horizontal direction Y.

In some embodiments, the first top source/drain region 16_P may overlap and/or contact the first channel region 14_P and may extend longitudinally in the first horizontal direction X, and the second top source/drain region 16_N may overlap and/or contact the second channel region 14_N and may extend longitudinally in the first horizontal direction X, as illustrated in FIG. 2B and FIG. 3A. The first top source/drain region 16_P and the second top source/drain region 16_N may be spaced apart from each other in the second horizontal direction Y.

The inverter may include a common gate layer 18. The common gate layer 18 may include a first portion 18_1 that may be on a side surface of the first channel region 14_P and may be a gate electrode of the P-type VFET, a second portion 18_2 that may be on a side surface of the second channel region 14_N and may be a gate electrode of the N-type VFET, and a third portion 18_3 that may continuously extend from the first portion 18_1 to the second portion 18_2 and may connect the first portion 18_1 to the second portion 18_2. The third portion 18_3 of the common gate layer 18 may be between the first channel region 14_P and the second channel region 14_N in the second horizontal direction Y as illustrated in FIG. 2A and FIG. 3B.

As the P-type VFET and the N-type VFET share the common gate layer 18, the same input may be applied to the P-type VFET and the N-type VFET as a gate input. Spacers 20 may be provided to electrically isolate the common gate layer 18 from the first and second bottom source/drain regions 12_P and 12_N and to electrically isolate the common gate layer 18 from the first and second top source/drain regions 16_P and 16_N. The first and second bottom source/drain regions 12_P and 12_N may be electrically isolated from each other by an isolation layer 10 (e.g., a shallow trench isolation layer) in the substrate 100.

A gate contact 34 may be provided on the common gate layer 18 and may contact the third portion 18_3 of the common gate layer 18. In some embodiments, the spacer 20 may not be provided on the third portion 18_3 of the common gate layer 18 to be contacted by the gate contact 34, as illustrated in FIG. 3B. The gate contact 34 may include metal, for example, cobalt (Co), tungsten (W), and/or copper (Cu). In some embodiments, the gate contact 34 may be spaced apart from the first channel region 14_P and the second channel region 14_N in the second horizontal direction Y. In some embodiments, the gate contact 34 may be equidistant from the first channel region 14_P and the second channel region 14_N, as illustrated in FIG. 2A and FIG. 3B.

A gate via 42g and a gate wire 44g may be sequentially stacked on the gate contact 34, as illustrated in FIG. 3B. In some embodiments, the gate via 42g may contact the gate contact 34, and the gate wire 44g may contact the gate via 42g, as illustrated in FIG. 3B. In some embodiments, an input of the inverter may be applied to the common gate layer 18 through the gate wire 44g. The gate wire 44g may be electrically connected to the common gate layer 18 through the gate via 42g and the gate contact 34. In some embodiments, the gate wire 44g may extend longitudinally in the second horizontal direction Y as illustrated in FIG. 2B.

A top contact layer 32 may be provided to electrically connect the first top source/drain region 16_P and the second top source/drain region 16_N. In some embodiments, the top contact layer 32 may extend longitudinally in the second horizontal direction Y and may contact a portion of the first top source/drain region 16_P and a portion of the second top source/drain region 16_N as illustrated in FIG. 2B and FIG. 3C. In some embodiments, the top contact layer 32 may have a different shape. For example, the top contact layer 32 may have a shape overlapping entireties of the first top source/drain region 16_P and the second top source/drain region 16_N. The top contact layer 32 may include metal, for example, Co, W, and/or Cu.

An output via 42o and an output wire 44o may be sequentially stacked on the top contact layer 32. In some embodiments, the output via 42o may contact the top contact layer 32, and the output wire 44o may contact the output via 42o, as illustrated in FIG. 3C. In some embodiments, the top contact layer 32 may be connected to an output node of the inverter through the output via 42o and the output wire 44o. Each of the output via 42o and the output wire 44o may include metal, for example, Co and/or Cu. In some embodiments, the output wire 44o may extend longitudinally in the second horizontal direction Y and may extend parallel to the gate wire 44g as illustrated in FIG. 2B. In some embodiments, the output wire 44o may be a metal line that is closest to the substrate 100 in the vertical direction Z and may be referred to as a first metal line used for routing or a metal one.

In some embodiments, the inverter may further include a first bottom contact 36_P and a second bottom contact 36_N. The first bottom contact 36_P may contact the first bottom source/drain region 12_P, and the second bottom contact 36_N may contact the second bottom source/drain region 12_N, as illustrated in FIG. 3B. In some embodiments, a first power having a first voltage (e.g., a drain voltage $V_{DD}$) may be applied to the first bottom source/drain region 12_P through the first bottom contact 36_P, and a second power having a second voltage (e.g., a source voltage $V_{SS}$) may be applied to the second bottom source/drain region 12_N through the second bottom contact 36_N. For example, each of the first and second bottom contacts 36_P and 36_N may include metal, for example, Co, W, and/or Cu. In some embodiments, each of the first and second bottom contacts 36_P and 36_N may extend longitudinally in the first horizontal direction X, and the first and second bottom contacts 36_P and 36_N may be spaced apart from each other in the second horizontal direction Y as illustrated in FIG. 2A. The first and second bottom contacts 36_P and 36_N may extend parallel to the first and second channel regions 14_P and 14_N.

Figure 4:
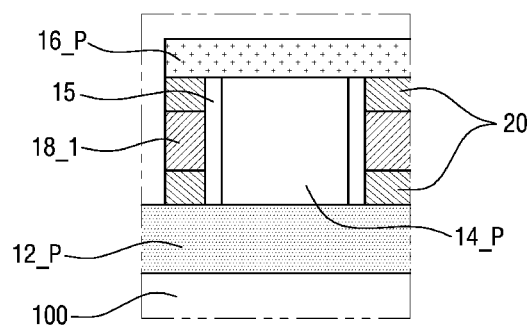
FIGS. 4 and 5 are enlarged views of the region A of FIG. 3B according to some embodiments of the present inventive concept.
Figure 5:
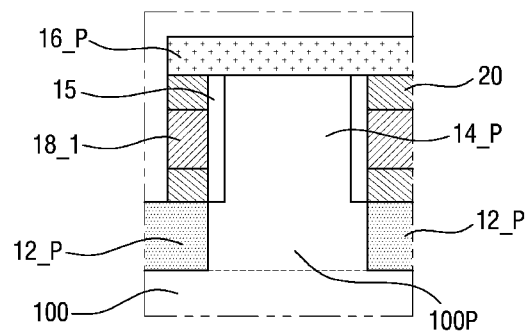

Each of FIG. 4 and FIG. 5 is an enlarged view of the region A of FIG. 3B according to some embodiments of the present inventive concept. Referring to FIGS. 4 and 5, a gate insulator 15 may be disposed between the first channel region 14_P and the first portion 18_1 of the common gate layer 18 to electrically isolate the first channel region 14_P and the common gate layer 18. In some embodiments, a lower surface of the first channel region 14_P may overlap and/or contact the first bottom source/drain region 12_P, as illustrated in FIG. 4.

In some embodiments, the lower surface of the first channel region 14_P may be connected to the substrate 100 through a protruding portion 100P of the substrate 100, and the first bottom source/drain region 12_P may be on a side surface of the protruding portion 100P of the substrate 100 as illustrated in FIG. 5. Although FIGS. 4 and 5 illustrate only the P-type VFET, it will be understood that the N-type VFET of the inverter may have a structure the same as or similar to the P-type VFET shown in FIGS. 4 and 5. Further, although FIGS. 4 and 5 show that the gate insulator 15 is also between the spacer 20 and the first channel region 14_P, it will be understood that the gate insulator 15 can be omitted between the spacer 20 and the first channel region 14_P, and the spacer 20 may contact the first channel region 14_P.

Figure 6:
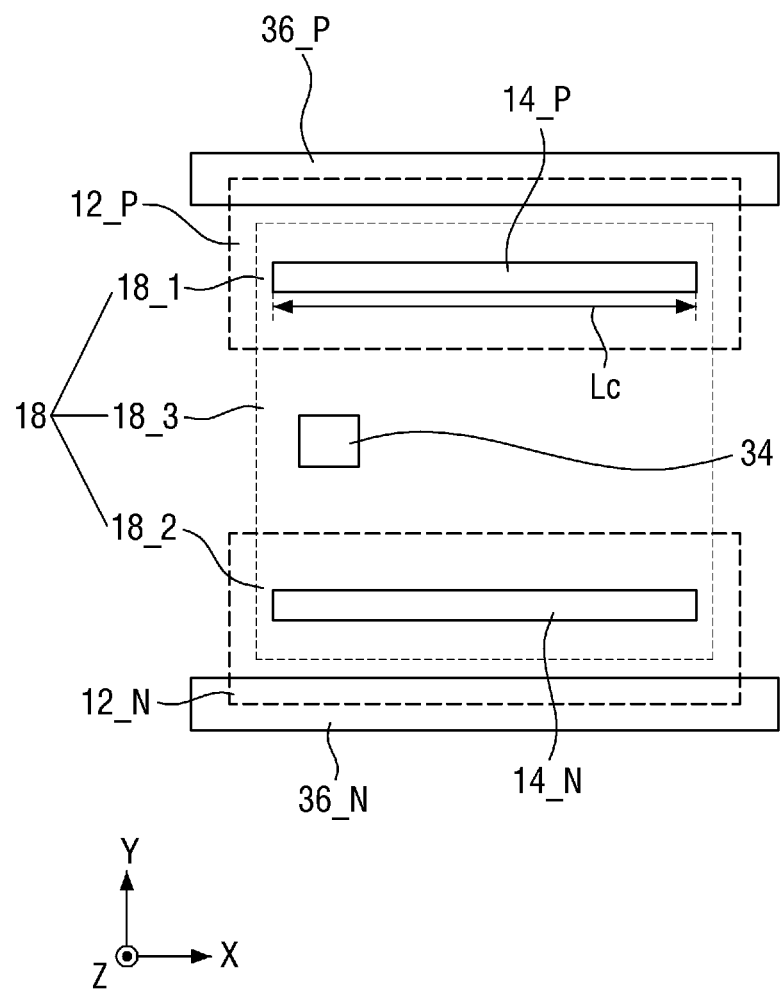
FIG. 6 is a layout of the inverter of FIG. 1 according to some embodiments of the present inventive concept.

FIG. 6 is a layout of the inverter of FIG. 1 according to some embodiments of the present inventive concept. FIG. 6 shows some elements, but not all, shown in FIGS. 2A and 2B to simplify the drawing, and elements that are shown in FIGS. 2A and 2B but not shown in FIG. 6 may be provided. Referring to FIG. 6, the third portion 18_3 of the common gate layer 18 may have a width in the first horizontal direction X equal to a width of each of the first portion 18_1 and the second portion 18_2 of the common gate layer 18.

Figure 7:
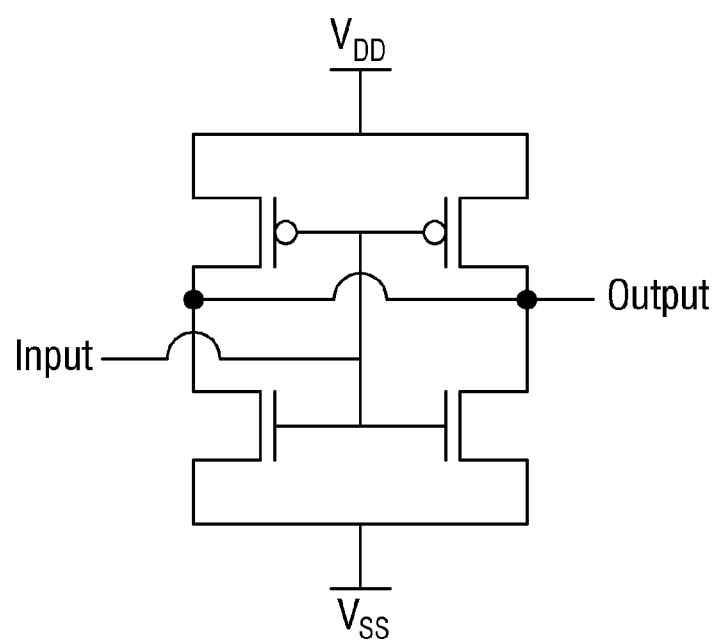
FIG. 7 is a circuit diagram of an inverter according to some embodiments of the present inventive concept.
Figure 8A:
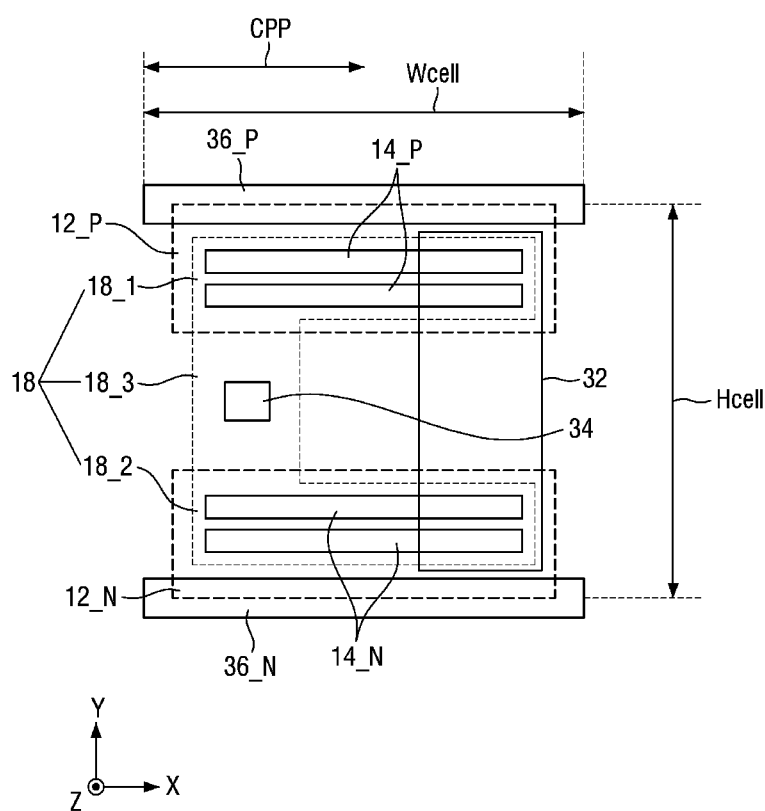
FIGS. 8A and 8B are layouts of the inverter of FIG. 7 according to some embodiments of the present inventive concept.
Figure 8B:
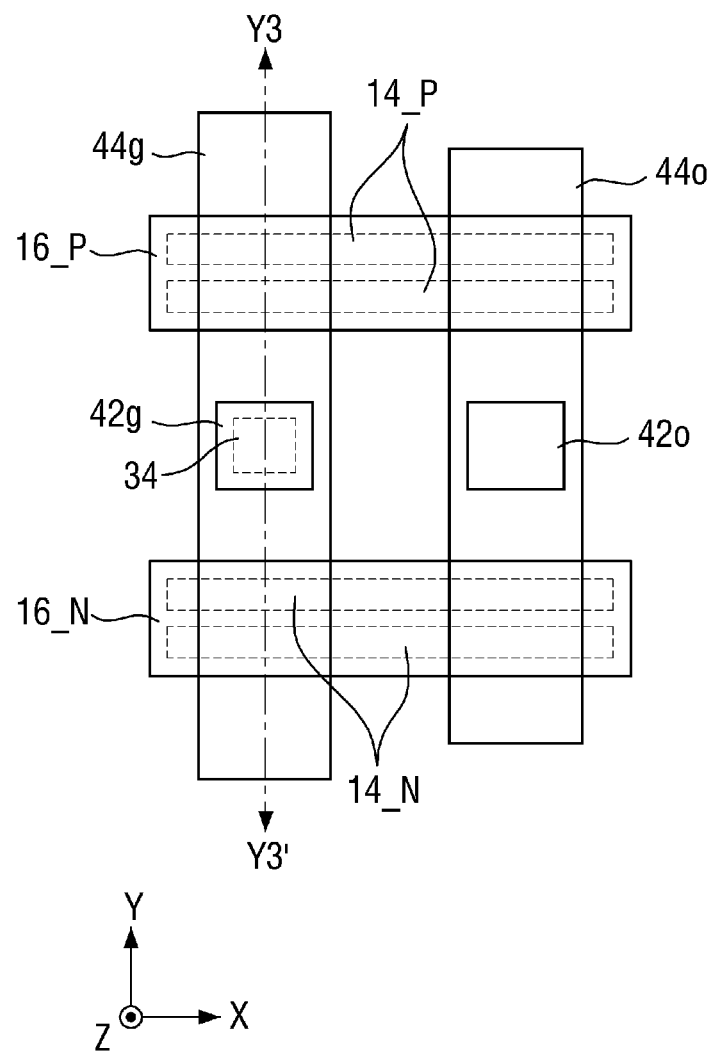

FIG. 7 is a circuit diagram of an inverter and FIGS. 8A and 8B are layouts of the inverter of FIG. 7, according to some embodiments. Each of FIGS. 8A and 8B shows a group of elements, rather than all elements, to simplify drawings. Each of FIGS. 9 and 10 are a cross-sectional view taken along the line Y3-Y3' in FIG. 8B.

Referring to FIG. 7, in some embodiments, an inverter may include two P-type VFETs connected in parallel and two N-type VFETs connected in parallel for better performance (e.g., higher current) compared with an inverter including a single P-type VFET and a single N-type VFET (e.g., the inverter shown in FIG. 1).

Figure 9:
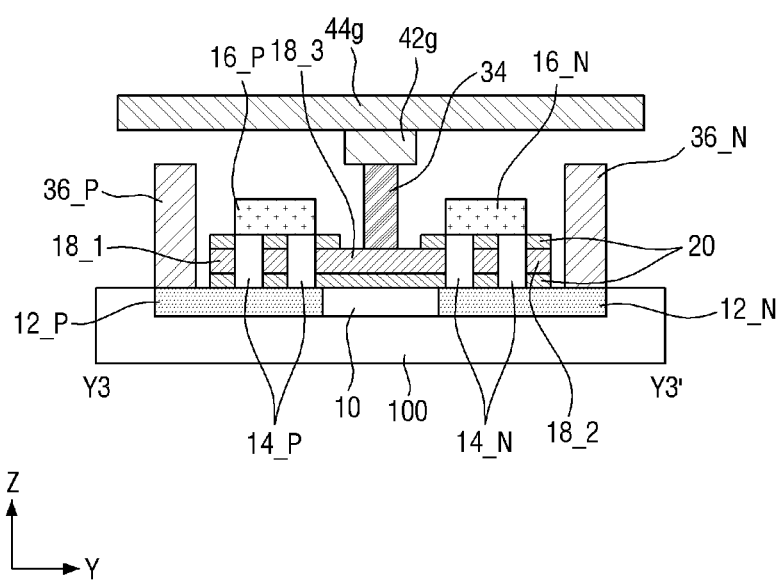
FIGS. 9 and 10 are cross-sectional views taken along the line Y3-Y3' in FIG. 8B according to some embodiments of the present inventive concept.
Figure 10:
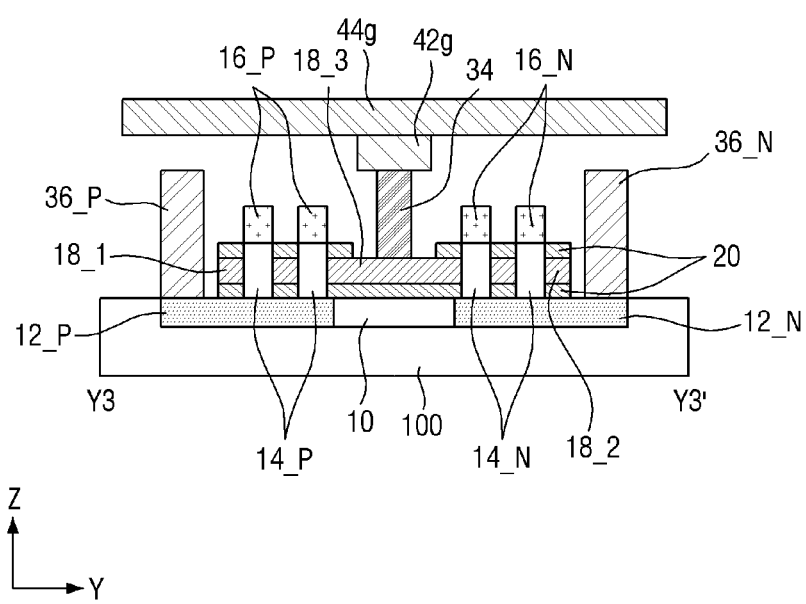

Referring to FIGS. 8A, 8B, and 9, the standard cell may have a width Wcell in the first horizontal direction X, and the width Wcell may be greater than a CPP of the standard cell. In some embodiments, the width Wcell may be equal to two times the CPP.

Two first channel regions 14_P may overlap and/or contact a first bottom source/drain region 12_P. Each of the two first channel regions 14_P may extend longitudinally in the first horizontal direction X, and the two first channel regions 14_P may be spaced apart from each other in the second horizontal direction Y. In some embodiments, a single first top source/drain region 16_P may overlap and/or contact the two first channel regions 14_P as illustrated in FIG. 8B and FIG. 9. The single first top source/drain region 16_P may extend longitudinally in the first horizontal direction X.

Two second channel regions 14_N may overlap and/or contact the second bottom source/drain region 12_N. Each of the two second channel regions 14_N may extend longitudinally in the first horizontal direction X, and the two second channel regions 14_N may be spaced apart from each other in the second horizontal direction Y. In some embodiments, a single second top source/drain region 16_N may overlap and/or contact the two second channel regions 14_N as illustrated in FIG. 8B and FIG. 9. In some embodiments, a single second top source/drain region 16_N may extend longitudinally in the first horizontal direction X. The two first channel regions 14_P may be spaced apart from the two second channel regions 14_N in the second horizontal direction Y.

A common gate layer 18 may include a first portion 18_1, a second portion 18_2, and a third portion 18_3 connecting the first portion 18_1 and the second portion 18_2. A gate contact 34 may be between the two first channel regions 14_P and the two second channel regions 14_N as illustrated in FIG. 8A and may contact a third portion 18_3 of the common gate layer 18.

In some embodiments, two separate first top source/drain regions 16_P may overlap and/or contact the two first channel regions 14_P, respectively, and two separate second top source/drain regions 16_N may overlap and/or contact the two second channel regions 14_N, respectively, as illustrated in FIG. 10.

Figure 11:
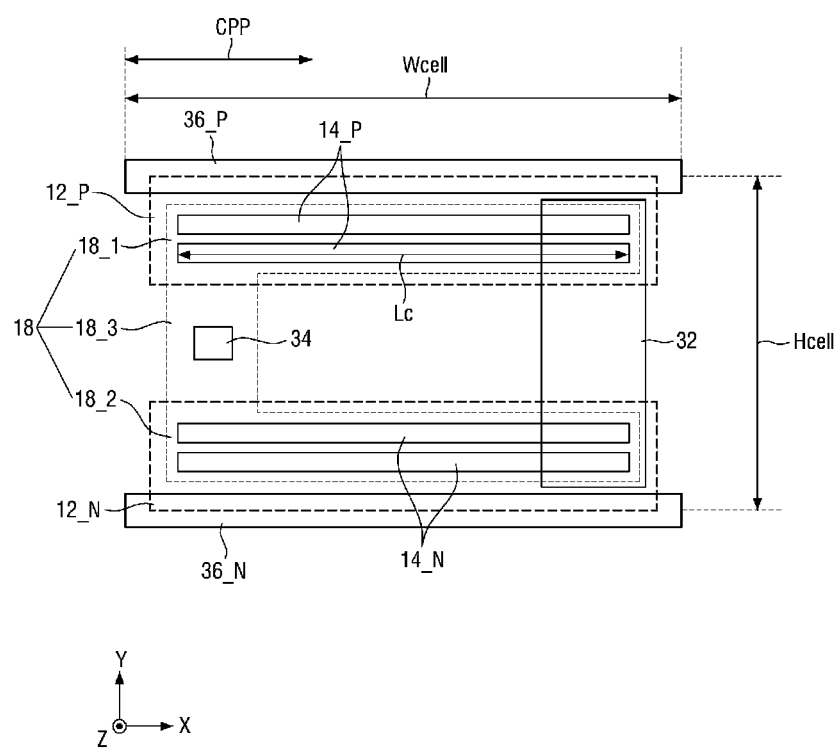
FIG. 11 is a layout of the inverter of FIG. 7 according to some embodiments of the present inventive concept.

FIG. 11 is a layout of the inverter of FIG. 7 according to some embodiments of the present inventive concept. FIG. 11 does not show some elements (e.g., 16_P, 16_N, 42g, 42o, 44g, and 44o in FIGS. 8A, 8B, 9, and 10) to simplify drawings but those elements may be provided.

Referring to FIG. 11, a width Wcell of the standard cell in the first horizontal direction X may be equal to three times the CPP of the standard cell, and each of the first channel regions 14_P and the second channel regions 14_N may extend longitudinally in the first horizontal direction X. As each of the first channel regions 14_P and the second channel regions 14_N may extend longitudinally in the first horizontal direction X, a length Lc of each of the first channel regions 14_P and the second channel regions 14_N may not be restricted by a height Hcell of the standard cell and may increase independently from the height Hcell of the standard cell.

Each of the first channel regions 14_P and the second channel regions 14_N may have a length Lc in the first horizontal direction X, and the length Lc may be longer than the CPP of the standard cell. In some embodiments, the length Lc of each of the first channel regions 14_P and the second channel regions 14_N may be longer than two times the CPP of the standard cell.

Figure 12:
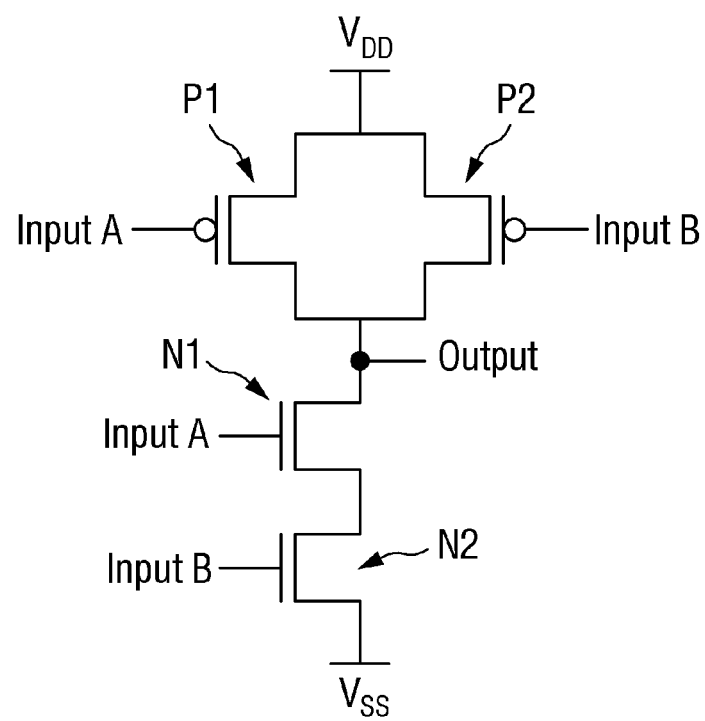
FIG. 12 is a circuit diagram of a 2-input NAND gate according to some embodiments of the present inventive concept.
Figure 13:
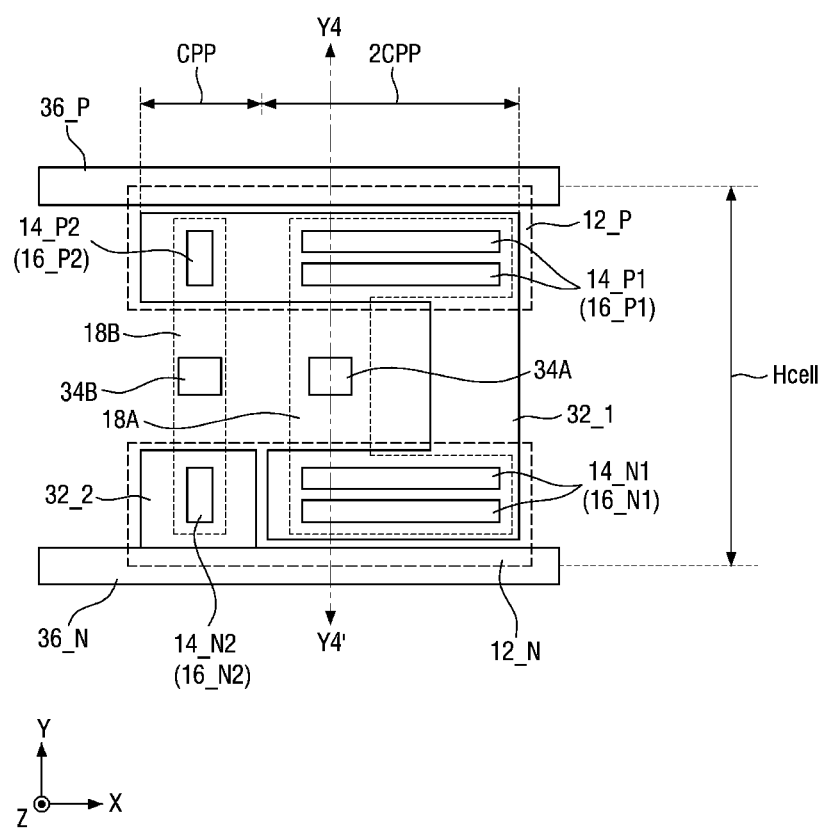
FIG. 13 is a layout of the 2-input NAND gate of FIG. 12 according to some embodiments of the present inventive concept.
Figure 14:
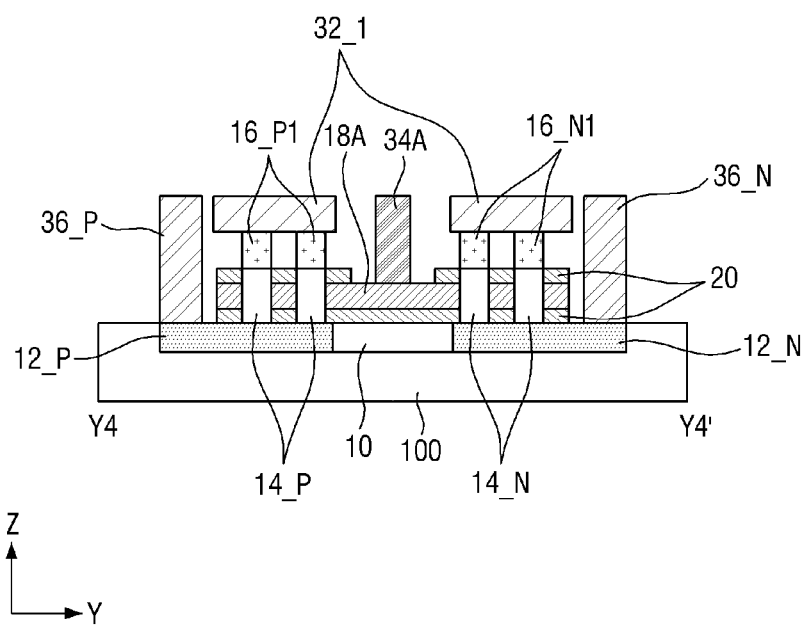
FIG. 14 is a cross-sectional view taken along the line Y4-Y4' of FIG. 13 according to some embodiments of the present inventive concept.

FIG. 12 is a circuit diagram of a 2-input NAND gate, and FIG. 13 is a layout of the 2-input NAND gate of FIG. 12 according to some embodiments of the present inventive concept. FIG. 14 is a cross-sectional view taken along the line Y4-Y4' of FIG. 13 according to some embodiments of the present inventive concept. FIGS. 13 and 14 do not show some elements (e.g., 42g, 42o, 44g, and 44o in FIGS. 8A, 8B, 9, and 10) to simplify drawings but those elements may be provided.

In some embodiments, the standard cell may be a 2-input NAND gate shown in FIG. 12. Referring to FIG. 12, the 2-input NAND gate may include a first P-type VFET P1 and a first N-type VFET N1 connected to each other the same as the circuit shown in FIG. 1. Accordingly, a layout and/or a cross-section of a portion of the standard cell including the first P-type VFET P1 and the first N-type VFET N1 of FIG. 12 may be the same as or similar to those shown in FIGS. 2 to 6 and FIGS. 8 to 11.

Referring to FIG. 12, the first P-type VFET P1 and the first N-type VFET N1 may share a first input (e.g., Input A) and an output (e.g., Output). The 2-input NAND gate may also include a second P-type VFET P2 and a second N-type VFET N2, which share a second input (e.g., Input B).

Referring to FIG. 13, the first P-type VFET P1 may include two first P-type VFETs including two first channel regions 14_P1, respectively. Each of the two first channel regions 14_P1 may extend longitudinally in the first horizontal direction X and may be spaced apart from each other in the second horizontal direction Y. Each of the two first P-type VFETs may also include a first bottom source/drain region 12_P and a first top source/drain region 16_P1.

The first N-type VFET N1 may include two first N-type VFETs including two second channel regions 14_N1, respectively. Each of the two second channel regions 14_N1 may extend longitudinally in the first horizontal direction X and may be spaced apart from each other in the second horizontal direction Y. Each of the two first N-type VFETs may also include a second bottom source/drain region 12_N and a second top source/drain region 16_N1.

In some embodiments, a single top source/drain region 16_P1 and a single second top source/drain region 16_N1 may be provided as illustrated in FIG. 9.

The second P-type VFET P2 may include a single second P-type VFET including a single third channel region 14_P2. The third channel region 14_P2 may extend longitudinally in the second horizontal direction Y. The second P-type VFET P2 may also include the first bottom source/drain region 12_P and a third top source/drain region 16_P2. The first bottom source/drain region 12_P may be shared by the two first P-type VFETs and the second P-type VFET.

The second N-type VFET N2 may include a single second N-type VFET including a single fourth channel region 14_N2. The fourth channel region 14_N2 may extend longitudinally in the second horizontal direction Y. The second N-type VFET may also include the second bottom source/drain region 12_N and a fourth top source/drain region 16_N2. The second bottom source/drain region 12_N may be shared by the two first N-type VFETs and the second N-type VFET.

Still referring to FIG. 13, the standard cell may include two regions that have different widths in the first horizontal direction X but have an equal height (e.g., Hcell) in the second horizontal direction Y. Specifically, the standard cell may include a first region having a first width that may be equal to two times the CPP (i.e., 2CPP) of the standard cell and a second region having a second width that may be equal to the CPP of the standard cell. The first P-type VFET P1 and the first N-type VFET N1 may be in the first region, and the second P-type VFET P2 and the second N-type VFET N2 may be in the second region. As each of the first channel regions 14_P1 and the second channel regions 14_N1 in the first region extends longitudinally in the first horizontal direction X, rather than the second horizontal direction Y, a length of each of the first channel regions 14_P1 and the second channel regions 14_N1 can be much longer than a half of the height Hcell of the standard cell.

The first bottom source/drain region 12_P and the second bottom source/drain region 12_N may be spaced apart from each other in the second horizontal direction Y, and each of the first bottom source/drain region 12_P and the second bottom source/drain region 12_N may extend longitudinally in the first horizontal direction X. A first bottom contact 36_P may overlap and/or contact the first bottom source/drain region 12_P. The first bottom contact 36_P may extend parallel to the first bottom source/drain region 12_P and may extend longitudinally in the first horizontal direction X. A second bottom contact 36_N may overlap and/or contact the second bottom source/drain region 12_N. The second bottom contact 36_N may extend parallel to the second bottom source/drain region 12_N and may extend longitudinally in the first horizontal direction X. The first bottom contact 36_P and the second bottom contact 36_N may be spaced apart from each other in the second horizontal direction Y.

Although FIG. 13 illustrates that each of the first P-type VFET P1 and the first N-type VFET N1 includes two transistors, and each of the second P-type VFET P2 and the second N-type VFET N2 includes a single transistor, it will be understood that one or both of the first P-type VFET P1 and the first N-type VFET N1 may include a single transistor as illustrated in FIG. 2A, and one or both of the second P-type VFET P2 and the second N-type VFET N2 may include two transistors.

Further, although FIG. 13 illustrates that each of the first P-type VFET P1 and the first N-type VFET N1 includes a channel region extending longitudinally in the first horizontal direction X, and each of the second P-type VFET P2 and the second N-type VFET N2 includes a channel region extending longitudinally in the second horizontal direction Y, it will be understood that one or both of the first P-type VFET P1 and the first N-type VFET N1 may include a channel region extending longitudinally in the second horizontal direction Y, and one or both of the second P-type VFET P2 and the second N-type VFET N2 may include a channel region extending longitudinally in the first horizontal direction X.

The 2-input NAND gate may include a first common gate layer 18A. A first portion of the first common gate layer 18A may be a gate electrode of each of the two first P-type VFETs P1, and a second portion of the first common gate layer 18A may be a gate electrode of the two first N-type VFETs N1. As the two first P-type VFETs P1 and the two first N-type VFETs N1 share the first common gate layer 18A, the same input (e.g., Input A in FIG. 12) may be applied to the two first P-type VFETs P1 and the two first N-type VFETs N1 as a gate input. Spacers 20 may be provided to electrically isolate the first common gate layer 18A from the first and second bottom source/drain regions 12_P and 12_N and to electrically isolate the first common gate layer 18A from the first and second top source/drain regions 16_P1 and 16_N1. The first and second bottom source/drain regions 12_P and 12_N may be electrically isolated from each other by an isolation layer 10.

The 2-input NAND gate may also include a second common gate layer 18B. A first portion of the second common gate layer 18B may be a gate electrode of the P-type VFET P2, and a second portion of the second common gate layer 18B may be a gate electrode of the second N-type VFET N2. As the second P-type VFET P2 and the second N-type VFET N2 share the second common gate layer 18B, the same input (e.g., Input B in FIG. 12) may be applied to the second P-type VFET P2 and the second N-type VFET N2 as a gate input. Spacers 20 may be provided to electrically isolate the second common gate layer 18B from the first and second bottom source/drain regions 12_P and 12_N and from the third and fourth top source/drain regions 16_P2 and 16_N2.

A first top contact layer 32_1 may extend on the two first P-type VFETs P1, the two first N-type VFETs N1, and the second P-type VFET P2. The first top contact layer 32_1 may contact and may electrically connect the two first top source/drain regions 16_P1, the two second top source/drain regions 16_N1, and the third top source/drain region 16_P2. The first top contact layer 32_1 may include metal, for example, Co, W, and/or Cu. The first top contact layer 32_1 may not overlap and may be spaced apart from the fourth top source/drain region 16_N2, as illustrated in FIG. 13.

A second top contact layer 32_2 may overlap and/or contact the fourth top source/drain region 16_N2 as illustrated in FIG. 13. In some embodiments, the second top contact layer 32_2 may contact the fourth top source/drain region 16_N2. As illustrated in FIG. 13, in some embodiments, the second top contact layer 32_2 may extend toward and contact the second bottom contact 36_N such that a source voltage $V_{SS}$ may be applied to the fourth top source/drain region 16_N2 through the second bottom contact 36_N and the second top contact layer 32_2. The second top contact layer 32_2 may include metal, for example, Co, W, and/or Cu.

The 2-input NAND gate may also include a first gate contact 34A and a second gate contact 34B. The first gate contact 34A may contact the first common gate layer 18A, and the second gate contact 34B may contact the second common gate layer 18B. In some embodiments, the first gate contact 34A and the second gate contact 34B may be spaced apart from each other in the first horizontal direction X and may be aligned along the first horizontal direction X, as illustrated in FIG. 13. In some embodiments, the first gate contact 34A and the second gate contact 34B may be aligned along the first horizontal direction X.

Figure 15:
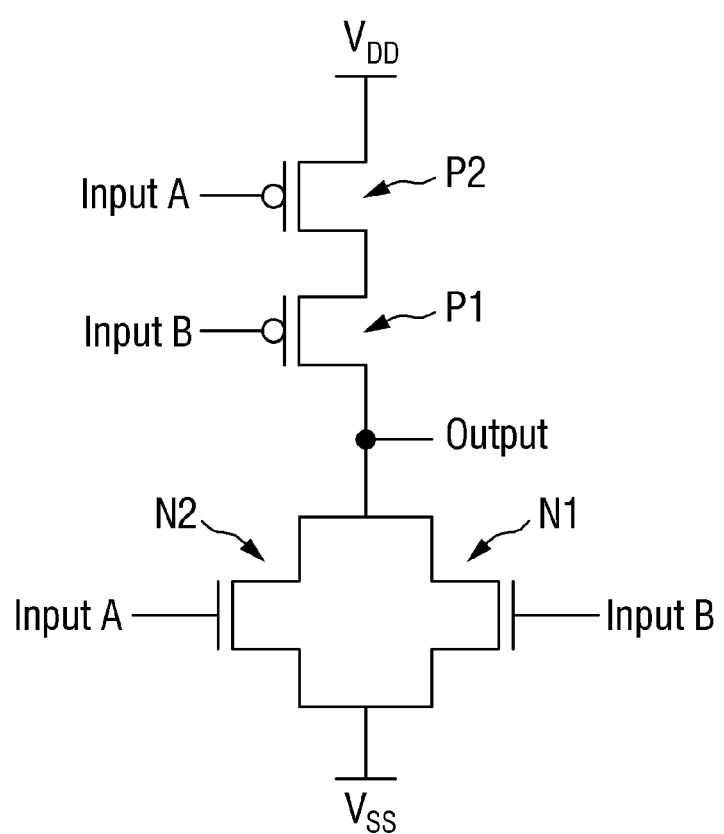
FIG. 15 is a circuit diagram of a 2-input NOR according to some embodiments of the present inventive concept.

FIG. 15 is a circuit diagram of a 2-input NOR according to some embodiments of the present inventive concept. The 2-input NOR of FIG. 15 may include a first P-type VFET P1 and a first N-type VFET N1 connected the same as the circuit shown in FIG. 1. The first P-type VFET P1 and the first N-type VFET N1 may share a first input (e.g., Input B) and an output (e.g., Output). The 2-input NOR may also include a second P-type VFET P2 and a second N-type VFET N2, which share a second input (e.g., Input A). The 2-input NOR shown in FIG. 15 is the same as the 2-input NAND gate shown in FIG. 12 except voltages (e.g., $V_{DD}$ and $V_{SS}$) applied to the second P-type VFET and the first and second N-type VFETs, and it will be understood that the 2-input NOR may have layouts and cross-sections the same as or similar to those shown in FIGS. 13 and 14.

Figure 16:
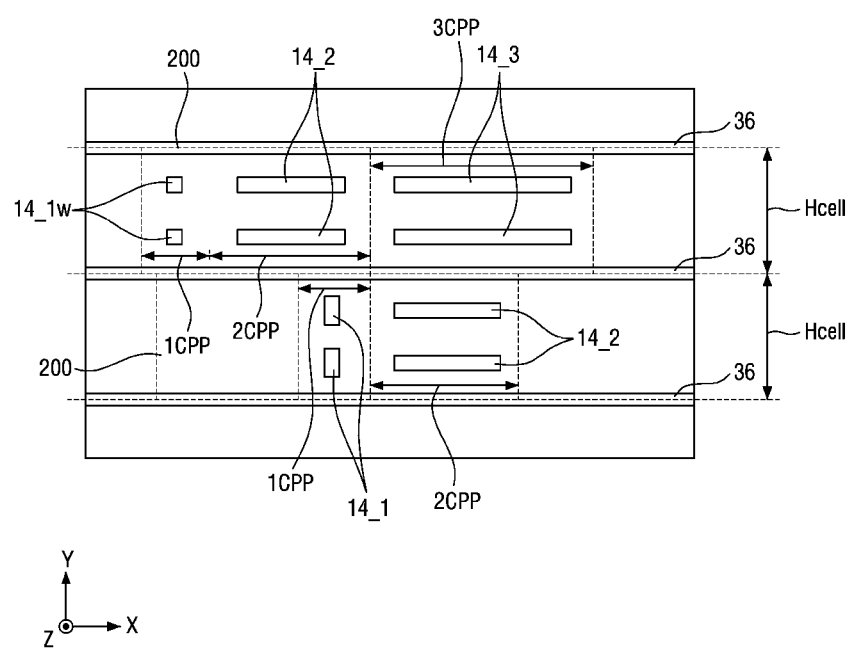
FIG. 16 is a layout of an integrated circuit device according to some embodiments of the present inventive concept.

FIG. 16 shows a simplified layout of an integrated circuit device including multiple standard cells according to some embodiments of the present inventive concept. Each of the standard cells may be enclosed by a cell boundary 200 represented by a dotted line. The integrated circuit device may include multiple power lines 36 extending longitudinally in a first horizontal direction X and may be spaced apart from each other in a second horizontal direction Y. Each of the power lines 36 may be divided by the cell boundary 200 as illustrated in FIG. 16.

Referring to FIG. 16, the integrated circuit device may include multiple standard cells that have different widths in the first horizontal direction X but have a uniform cell height Hcell in the second horizontal direction Y. A standard cell having a width equal to the CPP of the standard cell may include a channel region 14_1 extending longitudinally in the second horizontal direction Y, and a standard cell having a width wider than the CPP (e.g., two times the CPP (2CPP) or three times the CPP (3CPP)) may include a channel region (e.g., 14_2 or 14_3) extending longitudinally in the first horizontal direction X. The channel regions 14_2 and 14_3 may have a longer channel length than the channel region 14_1. A standard cell may include two regions having different widths in the first horizontal direction X and a channel region 14_1w having a square shape may be in a region having a width equal to the CPP of the standard cell. In some embodiments, the channel region 14_1w may be formed of a nanowire.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A standard cell comprising:
a first vertical field effect transistor (VFET) comprising a first channel region and having a first conductivity type; and
a second VFET comprising a second channel region and having a second conductivity type that is different from the first conductivity type,
wherein each of the first channel region and the second channel region extends longitudinally in a first horizontal direction,
the first channel region is spaced apart from the second channel region in a second horizontal direction that is perpendicular to the first horizontal direction, and
the first VFET further comprises a first bottom source/drain region in a substrate, and the second VFET further comprises a second bottom source/drain region in the substrate, and
wherein the standard cell further comprises:
a first bottom contact contacting the first bottom source/drain region and extending parallel to the first channel region, wherein the first bottom contact is electrically connected to a drain voltage or a source voltage; and
a second bottom contact contacting the second bottom source/drain region and extending parallel to the second channel region,
wherein each of the first bottom contact and the second bottom contact extends longitudinally in the first horizontal direction.

2. The standard cell of claim 1 further comprising:
a common gate layer comprising a first portion that is a first gate electrode of the first VFET, a second portion that is a second gate electrode of the second VFET, and a third portion that continuously extends from the first portion of the common gate layer to the second portion of the common gate layer; and
a gate contact that contacts the third portion of the common gate layer.

3. The standard cell of claim 2 further comprising a gate via and a gate wire, wherein the gate via and the gate wire are sequentially stacked on the gate contact in a vertical direction, and the gate wire is electrically connected to the common gate layer and extends longitudinally in the second horizontal direction.

4. The standard cell of claim 2, wherein each of the first and second portions of the common gate layer extends longitudinally in the first horizontal direction, and
the third portion of the common gate layer extends longitudinally in the second horizontal direction.

5. The standard cell of claim 1, wherein the first VFET further comprises a first top source/drain region on the first channel region, wherein the first bottom source/drain region, the first channel region, and the first top source/drain region are sequentially stacked on the substrate, and
wherein the second VFET further comprises a second top source/drain region on the second channel region, wherein the second bottom source/drain region, the second channel region, and the second top source/drain region are sequentially stacked on the substrate.

6. The standard cell of claim 5 further comprising an output wire that is electrically connected to the first top source/drain region and the second top source/drain region and extends longitudinally in the second horizontal direction.

7. The standard cell of claim 1 further comprising a third VFET comprising a third channel region and having the first conductivity type, wherein the third channel region extends longitudinally in the second horizontal direction.

8. The standard cell of claim 7,
wherein the first channel region and the third channel region are electrically connected to the first bottom source/drain region.

9. The standard cell of claim 1, wherein the first channel region comprises two first channel regions that are spaced apart from each other in the second horizontal direction.

10. The standard cell of claim 9, wherein each of the two first channel regions extends longitudinally in the first horizontal direction.

11. A standard cell comprising:
a first vertical field effect transistor (VFET) comprising a first bottom source/drain region in a substrate, a first channel region and a first top source/drain region sequentially stacked on the first bottom source/drain region in a vertical direction, wherein the first top source/drain region has a first conductivity type;
a second VFET comprising a second bottom source/drain region in the substrate, a second channel region and a second top source/drain region sequentially stacked on the second bottom source/drain region in the vertical direction, wherein the second top source/drain region has a second conductivity type that is different from the first conductivity type;
a common gate layer comprising a first portion that is on a side surface of the first channel region and is a first gate electrode of the first VFET and a second portion that is on a side surface of the second channel region and is a second gate electrode of the second VFET; and
a gate contact that is between the first channel region and the second channel region and contacts the common gate layer,
wherein each of the first channel region and the second channel region extends longitudinally in a first horizontal direction, and
the gate contact is spaced apart from the first channel region in a second horizontal direction that is perpendicular to the first horizontal direction, and
wherein the gate contact is overlapped by the first channel region and the second channel region in the second horizontal direction.

12. The standard cell of claim 11 further comprising a gate via and a gate wire, wherein the gate via and the gate wire are sequentially stacked on the gate contact in the vertical direction, and the gate wire is electrically connected to the common gate layer and extends longitudinally in the second horizontal direction.

13. The standard cell of claim 11 further comprising an output wire that is electrically connected to the first top source/drain region and the second top source/drain region and extends longitudinally in the second horizontal direction.

14. The standard cell of claim 11 further comprising:
a first bottom contact contacting the first bottom source/drain region and extending parallel to the first channel region, wherein the first bottom contact is electrically connected to a drain voltage or a source voltage; and
a second bottom contact contacting the second bottom source/drain region and extending parallel to the second channel region,
wherein each of the first bottom contact and the second bottom contact extends longitudinally in the first horizontal direction.

15. The standard cell of claim 11 further comprising a third VFET that comprises a third channel region and a third top source/drain region and has the first conductivity type,
wherein the third channel region and the third top source/drain region are sequentially stacked on the first bottom source/drain region, and
the third channel region extends longitudinally in the second horizontal direction.

16. A standard cell comprising:
a first vertical field effect transistor (VFET) having a first conductivity type, wherein the first VFET comprises two first channel regions that each extend longitudinally in a first horizontal direction;
a second VFET having a second conductivity type that is different from the first conductivity type, wherein the second VFET comprises a second channel region, and the second channel region extends longitudinally in the first horizontal direction; and
a third VFET having the first conductivity type, wherein the third VFET comprises a third channel region, and the third channel region extends longitudinally in a second horizontal direction that is perpendicular to the first horizontal direction.

17. The standard cell of claim 16, wherein the two first channel regions are spaced apart from each other in the second horizontal direction, and the second channel region is spaced apart from the two first channel regions in the second horizontal direction.

18. The standard cell of claim 16 further comprising:
a common gate layer comprising a first portion that is a first gate electrode of the first VFET, a second portion that is a second gate electrode of the second VFET, and a third portion that continuously extends from the first portion of the common gate layer to the second portion of the common gate layer; and
a gate contact that contacts the third portion of the common gate layer.

19. The standard cell of claim 18 further comprising a gate via and a gate wire,
wherein the gate via and the gate wire are sequentially stacked on the gate contact in a vertical direction, and
the gate wire is electrically connected to the common gate layer and extends longitudinally in the second horizontal direction.

* * * * *